(12) United States Patent
Baker et al.

(10) Patent No.: US 8,652,964 B2
(45) Date of Patent: Feb. 18, 2014

(54) METHOD AND APPARATUS FOR THE FORMATION OF AN ELECTRONIC DEVICE

(75) Inventors: Dean Bradley Baker, Bristol (GB); Catherine Ramsdale, Cambridge (GB); Martin Lewis, St. Albans (GB); Rashmi Sachin Bhintade, Winchester (GB)

(73) Assignee: Plastic Logic Limited, Cambridge (GB)

( * ) Notice: Subject to any disclaimer, the term of this patent is extended or adjusted under 35 U.S.C. 154(b) by 10 days.

(21) Appl. No.: 13/124,207

(22) PCT Filed: Sep. 28, 2009

(86) PCT No.: PCT/GB2009/051266
§ 371 (c)(1),
(2), (4) Date: Jun. 7, 2011

(87) PCT Pub. No.: WO2010/046678
PCT Pub. Date: Apr. 29, 2010

(65) Prior Publication Data
US 2011/0237053 A1    Sep. 29, 2011

(30) Foreign Application Priority Data

Oct. 21, 2008 (GB) .................................. 0819274.2
Feb. 23, 2009 (GB) .................................. 0902973.7

(51) Int. Cl.
*H01L 21/28* (2006.01)
*H01L 21/335* (2006.01)

(52) U.S. Cl.
USPC ................... 438/669; 438/725; 257/E21.038

(58) Field of Classification Search
USPC .......................... 438/669, 725; 257/E21.038
See application file for complete search history.

(56) References Cited

U.S. PATENT DOCUMENTS

| | | | |
|---|---|---|---|
| 7,132,678 B2 | 11/2006 | Kagan et al. | |
| 2002/0037479 A1 | 3/2002 | Schwartzkopf | |
| 2003/0228990 A1* | 12/2003 | Lee et al. ...................... | 510/202 |
| 2004/0185600 A1 | 9/2004 | Kagan et al. | |
| 2006/0289858 A1 | 12/2006 | Park et al. | |
| 2007/0251551 A1* | 11/2007 | Korzenski et al. .............. | 134/41 |
| 2008/0067504 A1 | 3/2008 | Park et al. | |
| 2011/0237053 A1* | 9/2011 | Baker et al. ................... | 438/478 |

FOREIGN PATENT DOCUMENTS

| | | | |
|---|---|---|---|
| GB | 2464566 A | * | 4/2010 |
| WO | WO 99/10939 | | 3/1999 |
| WO | WO 2006/113222 | | 10/2006 |

OTHER PUBLICATIONS

Bao, et al. "High-Performance Plastic Transistors Fabricated by Printing Techniques" Bell Laboratories, Lucent Technologies Recieved Feb. 26, 1997. p. 1299-1301.
Rogers, et al. "Low-Voltage 0.1 um Organic Transistors and Complementary Inverter Circuits Fabricated with . . . " Bell Laboratories. Recieved May 24, 1999. pp. 1010-1012.

(Continued)

*Primary Examiner* — George Fourson, III
(74) *Attorney, Agent, or Firm* — Hamilton DeSanctis & Cha

(57) ABSTRACT

A process of forming an electronic device, by forming the source and drain contacts using photolithography, incorporating a self-assembled monolayer (SAM) over the electrical contacts to form an increased work function of the source and drain electrodes and further forming more favorable charge injection properties or within the channel region to improve film morphology and therefore improve charge transport. The SAM material is added to the photoresist stripper during a step of the photolithography process of forming electrical contacts.

20 Claims, 4 Drawing Sheets

A)

B)

(56) References Cited

OTHER PUBLICATIONS

Visintin, et al. "Liquid Clean Formulations for Stripping High-Dose Ion-Implanted Photoresist from . . . " Journal of the Electrochemical Society pp. 591-597. 2006.

Brittain, S et al "Soft Lithography and Microfabrication" Physics World May 1998, p. 31-36.
Chen, et al "Tuning the Hole Injection Barrier at the Organic/Metal Interface with Self-Assembled Functionalized Aromatic Thiols" J Phys Chem V vol. 110 2006 pp. 26075-26080.
European Search Report received Apr. 5, 2013.

* cited by examiner

A)

B)

METHOD AND APPARATUS FOR THE FORMATION OF AN ELECTRONIC DEVICE

CROSS REFERENCE TO RELATED APPLICATION

The present application claims priority to (is a US National Stage Filing of) PCT Application No. PCT/GB2009/051266 filed Sep. 28, 2009. The aforementioned PCT application claims priority to British Patent Application No. GB0819274.2 filed Oct. 21, 2008, and British Patent Application No. GB0902973.7 filed Feb. 23, 2009. The entirety of each of the three aforementioned references is incorporated herein by reference for all purposes.

BACKGROUND OF THE INVENTION

The present inventions relate to processes of forming an electronic device, processes of making a photoresist mixture, and photoresist stripper mixtures; and more particularly to devices such as organic electronic devices and methods for forming such devices.

Techniques such as photolithography are known for patterning various elements of thin film transistors, such as polymer conductors, semiconductors and insulators. Photolithography is a process used in microfabrication to selectively remove parts of a thin film. The process uses light to transfer a pattern from a photomask to a light-sensitive photoresist on the substrate. A series of chemical treatments forms the pattern on the material underneath the photoresist.

During photolithography, a uniform thin film of photoresist is deposited onto the substrate, by techniques, such as spin and slot coating and blade coating. A viscous, liquid solution of photoresist is deposited onto the substrate, and the substrate is spun rapidly to produce a uniformly thick layer. The photoresist-coated substrate is then soft-baked to drive off excess solvent. After baking, the photoresist is exposed to a pattern of intense light. An optical lithography typically uses ultraviolet light, which is shone through a photomask. Positive photoresist becomes soluble in the basic developer when exposed. This chemical change allows some of the photoresist to be removed by a developer solution.

During the etching process, a chemical agent removes the uppermost layer of the substrate in the areas that are not protected by photoresist. After a photoresist is no longer needed, the photoresist is removed from the substrate. This usually requires a liquid photoresist stripper, which dissolves the photoresist material.

When a SAM is deposited on top of a conductive layer, such as the source and drain electrodes, the work function of the conductive material may increase, therefore resulting in an increase in charge injection from the source and drain contacts across the neighboring semiconductor device channel.

Processes for depositing such a self-assembled monolayer include wet processes, such as spray coating, dip coating and spin coating. These deposition techniques of the SAM material to increase the work function of the conductive material, for example of the electrical contacts, involve additional process steps that use multiple tools within a process, at further expense.

Hence, there exists a need in the art for systems and methods for improved electronics processing procedures.

BRIEF SUMMARY OF THE INVENTION

The present inventions relate to processes of forming an electronic device, processes of making a photoresist mixture, and photoresist stripper mixtures; and more particularly to devices such as organic electronic devices and methods for forming such devices.

Various embodiments of the present invention provide processes of forming an electronic device having a substrate and a conductive layer. The processes include removing photoresist from at least one surface of the electronic device using a photoresist stripper mixture. The photoresist stripper mixture comprises a first self-assembled monolayer material and photoresist stripper for dissolving photoresist, thereby depositing a self-assembled monolayer on said at least one surface of said electronic device.

In some instances of the aforementioned embodiments, the surface includes at least one surface of said conductive layer and/or a surface of said substrate. In some such instances, the electronic device includes a source electrode and a drain electrode and a device channel neighboring said source and drain electrodes, and the surface of the substrate comprises a surface of the device channel. In various of such instances, the electronic device includes a source electrode and a drain electrode and a device channel neighboring said source and drain electrodes, and the at least one surface of said conductive layer comprises a surface of the source electrode and a surface of the drain electrode. In some particular cases, the processes further include depositing semiconductor material on said self-assembled monolayer deposited on said conductive layer, without ozone cleaning of said conductive layer.

In one or more instances of the aforementioned embodiments, the electronic device includes a source electrode and a drain electrode. The processes further include the depositing of the first self-assembled monolayer material, the surface comprising a surface of the source electrode and a surface of said drain electrode; and then depositing a second self-assembled monolayer material, which is different from said first self-assembled monolayer material, on a surface of said substrate. In some instances of the aforementioned embodiments, the processes further include using said photoresist in a photolithography process of patterning said conductive layer to form a source electrode and a drain electrode. In some cases, the processes further include using said photoresist in a photolithography process of patterning said conductive layer to form said source electrode and said drain electrode.

Other embodiments of the present invention provide processes of making a photoresist stripper mixture. The photoresist stripper mixture comprises self-assembled monolayer material and further comprises photoresist stripper for dissolving photoresist, the photoresist stripper comprising a glycol component and one or more further components. The processes include adding the self-assembled monolayer material to the glycol component; and then adding to the self-assembled monolayer material and the glycol component the remaining components of the photoresist stripper. In some cases, the glycol component comprises glycol ether and the remaining components comprises 2-amino ethanol and de-ionized water.

Yet other embodiments of the present invention provide photoresist stripper mixtures that include: a self-assembled monolayer material; and photoresist stripper for dissolving photoresist. In some cases, the self-assembled monolayer material comprises a thiol compound comprising sulphur. In various cases, the self-assembled monolayer material comprises pentafluorobenzenethiol. In one or more cases, the photoresist stripper comprises 2-amino ethanol, glycol ether and de-ionized water. In particular cases, the ratio of the self-assembled monolayer material to the photoresist stripper is about 0.0001%-1%.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
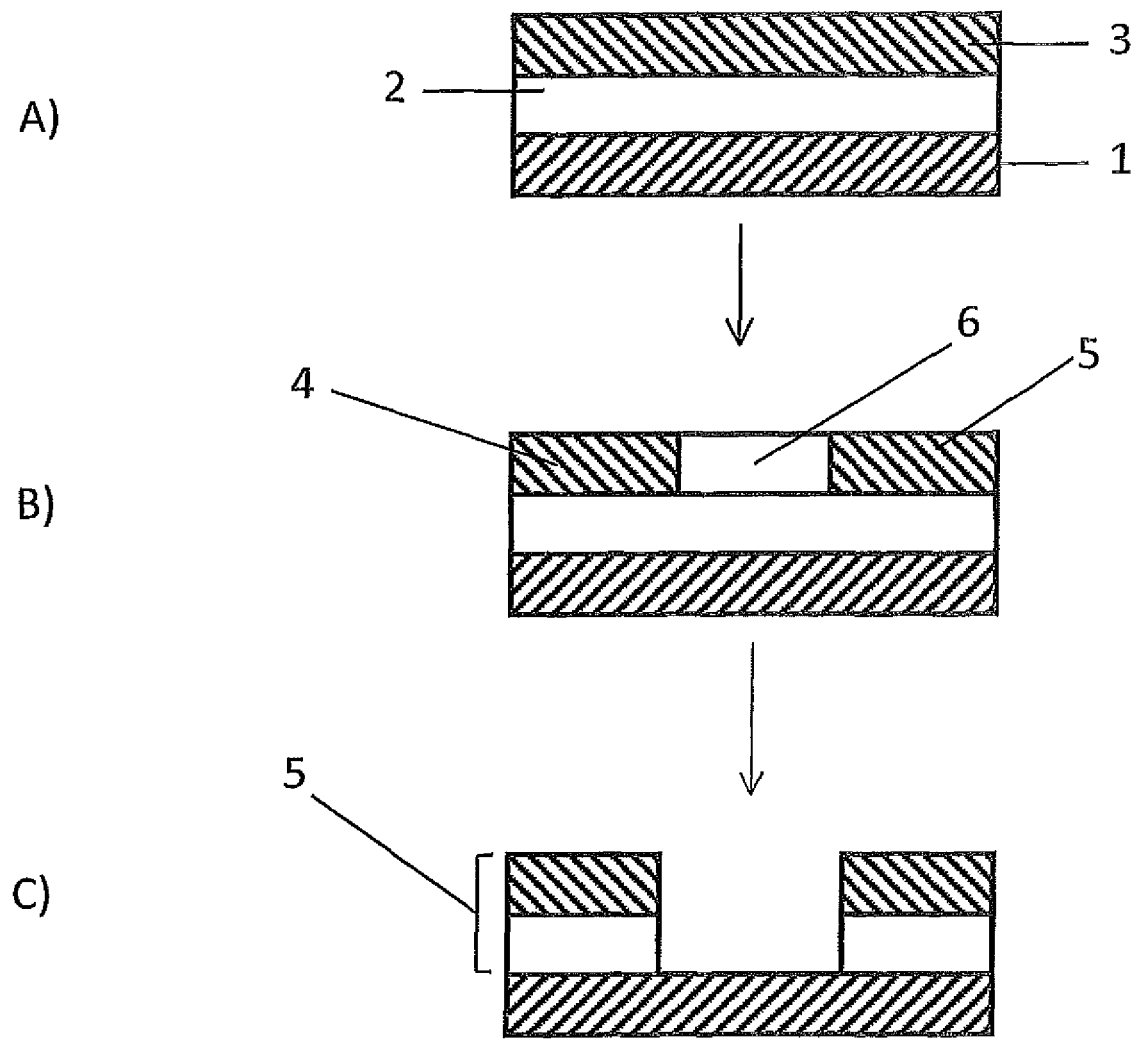
FIG. 1 shows the photoresist deposition and patterning steps, followed by the etching step, according to the photolithography process.

The present inventions relate to processes of forming an electronic device, processes of making a photoresist mixture, and photoresist stripper mixtures; and more particularly to devices such as organic electronic devices and methods for forming such devices.

According to a first aspect of the present invention, there is provided a process of forming an electronic device, the electronic device comprising a substrate and a conductive layer, the process comprising: removing photoresist from at least one surface of the electronic device using a photoresist stripper mixture, wherein the photoresist stripper mixture comprises a first self-assembled monolayer material and photoresist stripper for dissolving photoresist, thereby depositing a self-assembled monolayer on said at least one surface of said electronic device.

For example, a process of forming an electronic device, the electronic device comprising a substrate and a conductive layer, the process comprising: removing photoresist from at least one surface of the electronic device, and depositing a self-assembled monolayer to at least one surface of the electronic device in one process step, by using a mixture of photoresist stripper (for removing the photoresist), and SAM materials (for deposition onto at least one surface of the electronic device).

In such an embodiment, the at least one surface may comprise at least one surface of said conductive layer and/or a surface of said substrate. For example, the at least one surface may be one or more electrodes or electrical contacts, such as a source electrode and a drain electrode. Additionally or alternatively, the substrate surface may be the surface of a semiconductor device channel between such electrical contacts.

Thus, the removal of the photoresist and the deposition of the self-assembled monolayer occur within the same photolithography process step (the removal of photoresist), thereby, reducing the total number of process steps. In particular, the SAM material may be added to the photoresist stripper to produce a mixture and this mixture is deposited during the step in the photolithography process of resist stripping. This step exposes the defined contacts.

Thus, for example, the photoresist, which is removed in the above embodiments, may be used in a photolithography process of patterning said conductive layer to form a source electrode and a drain electrode.

Where the electronic device comprises a source electrode and a drain electrode, and a semiconductor device channel neighboring said source and drain electrodes, the surface of said substrate may comprise a surface of said semiconductor device channel.

Where the electronic device comprises a source electrode and a drain electrode, and a semiconductor device channel neighboring said source and drain electrodes, the at least one surface of said conductive layer may comprise a surface of the source electrode and a surface of the drain electrode.

The process may further comprise depositing semiconductor material on said self-assembled monolayer deposited on said conductive layer, without ozone cleaning of said conductive layer. The omitted ozone cleaning step may be ozone cleaning after deposition of the conductive layer to improve adhesion of subsequently deposited photoresist and/or may be ozone cleaning more immediately prior to the deposition of a further layer, e.g., a self-assembled monolayer or semiconductor layer, on a surface of the conductive layer.

Where the electronic device comprises a source electrode and a drain electrode, the process may further comprise the above depositing of the first self-assembled monolayer material on a surface of said source electrode and a surface of said drain electrode, followed by deposition of a second self-assembled monolayer material, which is different from said first self-assembled monolayer material, on a surface of the substrate.

In the above embodiments, the process may further comprise removing the photoresist in a photolithography process to pattern the conductive layer to form the source and drain electrodes.

According to a second aspect of the present invention, there is provided a process of making photoresist stripper mixture, wherein the photoresist stripper mixture comprises self-assembled monolayer material and further comprises photoresist stripper for dissolving photoresist, the photoresist stripper comprising a glycol component and one or more further components, the process comprising: adding the self-assembled monolayer material to the glycol component; and then adding to the self-assembled monolayer material and the glycol component the remaining components of the photoresist stripper. The glycol component may comprise glycol ether, the remaining components comprising 2-amino ethanol and de-ionized water.

According to a third aspect of the present invention, there is provided a photoresist stripper mixture comprising self-assembled monolayer material and further comprising photoresist stripper for dissolving photoresist. The self-assembled monolayer material may comprise a thiol compound comprising sulphur or may comprise pentafluorobenzenethiol. The photoresist stripper may comprise 2-amino ethanol, glycol ether and de-ionized water. Further still, the ratio of the self-assembled monolayer material to the photoresist stripper may be about 0.0001%-1%.

Thus, in all the above aspects and embodiments, the photoresist stripper mixture may be a photoresist stripper solution/SAM mixture.

In an embodiment, the above SAM deposition step is advantageously incorporated into an established process, by depositing the SAM material during an existing step within the photolithography process, such as during the deposition of the photoresist stripper.

An embodiment may provide a process of forming an electronic device incorporating a SAM layer deposited over the source and drain electrodes, in order to increase the work function of the source and drain electrodes, and further form more favourable charge injection properties.

In a preferred embodiment, the SAM material may be added to an existing photolithography step, by mixing the SAM material with the stripper material, thereby enabling the removal of unwanted photoresist and the deposition of the SAM in the same process.

An embodiment provides a process of forming an electronic device, by forming the source and drain contacts using photolithography, incorporating at least one self-assembled monolayer (SAM) over the electrical contacts to form an increased work function of the source and drain electrodes and further forming more favourable charge injection properties or within the channel region to improve film morphology and therefore improve charge transport. The SAM material is added to the photoresist stripper and deposited during a step of the photolithography process of forming electrical contacts.

Further, an embodiment may provide a process of forming an electronic device incorporating a SAM layer that is deposited over the substrate surface, to form improved morphology for charge transport. The deposition of the SAM material is again added to an existing photolithography step, by mixing the SAM material with the stripper material, thereby reducing the number of process steps.

With reference to FIG. 1, the first embodiment of the present invention is now described in detail.

Embodiment 1—Deposition of a thiol-based SAM layer, together with the photoresist stripper:

A substrate 1 is coated with a layer of conductive material 2, as shown in FIG. 1 A). The substrate may be either glass or a polymer film. According to a preferred embodiment of the invention, the substrate is a plastic substrate, such as a film of polyethyleneterephtalate (PET) or polyethylenenaphtalene (PEN), which may have an optional planarization coating deposited over the substrate to provide high film quality. A first conductive layer 2, which is preferably a layer of inorganic metal such as silver (Ag), and most preferably gold (Au), may also be used or any metal that adheres well to the substrate. A bilayer structure may be deposited, including a seed or adhesion layer in between the layer of metallic material and the substrate. Alternatively, a conductive polymer may be used, such as polyethylenedioxythiophene doped with polystyrene sulfonic acid (PEDOT/PSS). The conductive layer is preferably sputtered or deposited from solution by standard thin film coating techniques, including but not limited to, spin, dip, blade, bar, slot-die, or spray coating, inkjet, gravure, offset or screen printing. The said conductive material will form the basis for the source and drain electrodes of the transistor device.

After the deposition of the conductive layer, the substrate surface is cleaned to eliminate the presence of any organic or inorganic contaminations. Such contaminants may be removed by techniques such as wet chemical treatment. Alternatively, the substrate with deposited gold layer is placed under a U.V. lamp. The U.V. lamp is at 172 nm and cleans the surface of the substrate of contamination, such as hydrocarbons. The U.V. reacts with oxygen to form ozone. The ozone then further reacts with the remaining hydrocarbons on the substrate surface to eliminate any remaining hydrocarbons.

The substrate is then prepared by heating said substrate to a temperature sufficient to drive off any moisture that may be present on the substrate surface. A liquid or gaseous adhesion promoter may be used, such as Bis(trimethylsilyl)amine to promote adhesion of the photoresist to the substrate surface.

The substrate is covered with a photoresist material 3 by a technique, such as spin, slot, spin and blade coating, as is shown in FIG. 1 A). Such a photoresist material may be AZ1500 (AZ) or SU8 (Microchem). A viscous, liquid solution of photoresist is dispensed onto the substrate, and the substrate is spun to produce a uniformly thick layer of photoresist over the underlying substrate surface. The spin coating typically runs at 1200 to 4800 rpm for 30 to 60 seconds, and produces a layer between 0.5 and 2.5 micrometers thick. The photoresist-coated substrate is then prebaked to drive off excess solvent, typically at a temperature of 70 to 100° C. for up to 30 minutes.

A portion of the conductive material may then be patterned by techniques such as laser ablation, optical lithography and wet etching. For example, the channel region of the TFT can be defined in this first step, while leaving the remaining portion of the film unpatterned. This process is used to define the conductive material to form the channel 5 regions of the device. Preferably, standard photolithography techniques may be used to define the source and drain contacts.

After prebaking, the photoresist layer is exposed to a pattern of intense light 6 through a specifically designed photomask, as shown in FIG. 1 B). Optical lithography typically uses ultraviolet light. The current process uses positive photoresist, which becomes soluble in the basic developer when exposed to light. This chemical change allows some of the photoresist to be removed by a solution, called a developer. The developer is deposited, using techniques such as spin coating. Developers originally contain sodium hydroxide (NaOH) or tetramethylammonium hydroxide (TMAH).

The resulting substrate and photoresist pattern may then be baked, such as hard-baked. Typically, the substrate is hard-baked at between 100° C. to 150° C. for up to 30 minutes. The process step of hard baking solidifies the remaining photoresist material, making a more durable protecting layer for the subsequent etching steps.

During the etching step (FIG. 1 C)), a chemical agent removes the uppermost layer of the substrate in the areas that are not protected by the photoresist, as per the previous steps of the process. Alternatively, dry-etching techniques are used, as they can be made anisotropic, in order to avoid significant undercutting of the photoresist pattern. This is essential when the width of the features to be defined is similar to or less than the thickness of the material being etched.

After the photoresist material is no longer required, the photoresist layer is removed from the substrate. This usually requires a liquid photoresist stripper, which dissolves the photoresist material. The photoresist stripper may contain a self-assembled monolayer (SAM). A self-assembled monolayer which is suitable for deposition onto gold (Au) is pentafluorobenzenethiol. However, other suitable SAM materials include other thiol compounds that contain sulphur bonds that bond to the surface to be deposited onto, such as gold. SAM materials based on silane compounds may be used for deposition onto acrylics or other planarising layers of a substrate. Such a stripper material may comprise component parts, such as 2-amino ethanol, glycol ether and de-ionised (DI) water. The SAM may be added to the stripper at a ratio of ~0.0001%-1%. A suitable stripper includes (Nagase) N321. It was observed that some SAM materials produce fumes when added to the stripper material. Whilst this does not necessarily have an adverse reaction on performance, such fuming may be undesirable in large volumes. To avoid such fuming, the most preferred route for formulation would be to first add the SAM material to the glycol either component of the stripper, followed by the addition of the remaining stripper constituents to form the stripper material. However, it has been observed that the SAM material can be added directly to the stripper without detriment to the final performance of the solution.

Figure 2:
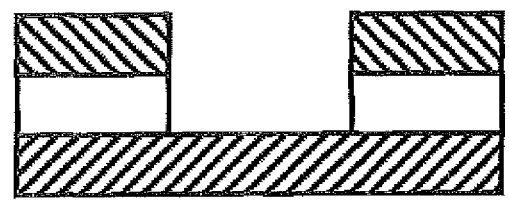
FIG. 2 illustrate the deposition of a SAM material over the source and drain contacts.
Figure 2:
Figure 2:
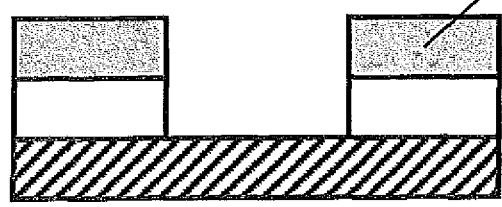

The mixture of photoresist stripper and SAM is then deposited over the electrical contacts incorporating the photoresist by the technique of spray coating, as shown in FIG. 2. The presence of the SAM 6 over the source and drain electrodes may change the surface energy of the source and drain contacts by increasing the work function of the conductive elements and therefore enabling a more favourable charge injection from the contacts into the semiconductor. Further, the addition of the SAM material may prevent the contamination of the gold source and drain contacts. Contamination may be in the form, for example, of hydrocarbons forming on the surface of the source and drain electrodes. After the patterning of the conductive layer to form the source and drain electrodes, the substrate surface is further cleaned by rinsing with DI water or PGMEA to eliminate the presence of any organic or inorganic contaminations. Such contaminants may be removed by techniques such as wet chemical treatment.

In the case of SAM deposition onto gold (Au), the removal of the photoresist and the deposition of the self-assembled monolayer occur within the same process step, thereby, reducing the total number of process steps and ensures that the gold is of optimal cleanliness in order to adhere the SAM material. The affinity of the SAM material to the gold layer, may further aid the removal of the photoresist material from the surface of the gold. The stripper acts to remove the photoresist material and at the same time the SAM is deposited and adheres to the gold. Combining these stages may minimize the chance of contaminants landing on the gold surface and may ensure that the SAM is attached to the gold in its cleanest state.

Further, the affinity of the self-assembled monolayer to the gold contacts may remove the need for the ozone step within the process. This affinity occurs by the formation of a bond between the gold and the sulphur atoms, within the thiol compounds. The removal of the ozone step is preferable, due to the fact that the ozone has a high energy surface and is hard to maintain for any length of time and is very susceptible to airborne contaminants, which may degrade the underlying layers of the device structure. The self-assembled monolayer is a more stable compound, compared to ozone and is therefore a preferable compound.

Once the conductive layer has been patterned to form the source and drain electrodes through the above described photolithography process and the self-assembled monolayer has been deposited over the source and drain contacts, a layer of semiconducting material may then be deposited, using techniques, such as vapour deposition. The semiconducting layer may consist of materials such as, but not limited to, triarylamines, pentacene, polyarylamine, polyfluorene or polythiophene derivatives. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating or flexographic printing.

The above is also true for silane-based SAM materials deposited onto acrylics or other planarising coatings, as described below in embodiment 2.

Figure 3:
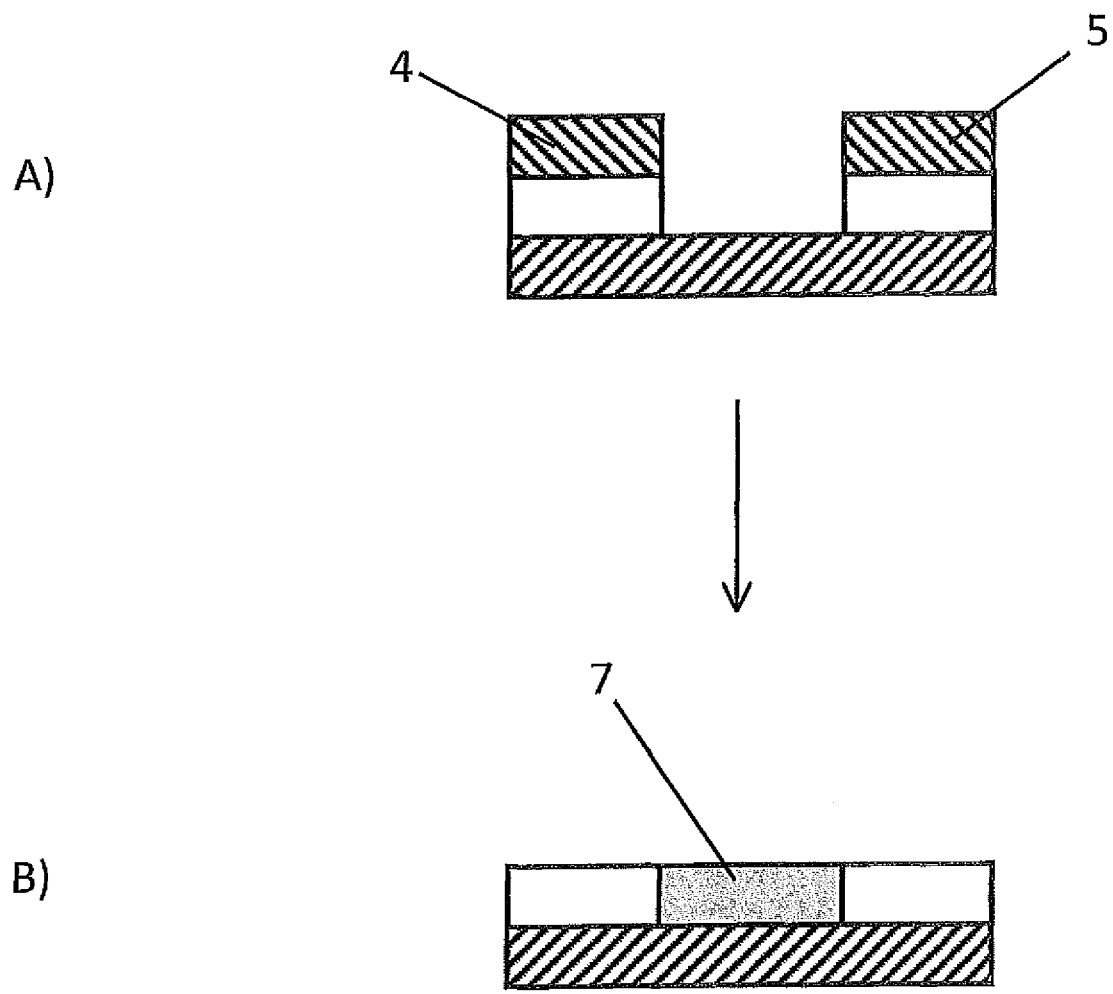
FIG. 3 shows the deposition of a SAM material within the channel region.

Embodiment 2—SAM material deposited over the substrate surface:

Alternatively, FIG. 3 shows that after the conductive layer has been patterned to form the source and drain electrodes 4, 5 through the above described photolithography process, the self-assembled monolayer 7 may be deposited over the substrate surface, such that the SAM adheres to the surface of the substrate, but not the source and drain contacts, as is shown in FIG. 3 B). The SAM material is mixed with the photoresist stripper, and this mixture is used at the existing photolithography step of photoresist stripping, during which time the mixture is deposited over the substrate surface, including the electrical contacts. The deposition of the SAM on to the substrate surface has the effect of improving charge transport, through morphological control.

Alternatively, the SAM material to be deposited on the semiconductor device channel may be added to the etch process step by mixing the SAM material with the etchant used for removing the conductive layer in contact with the planarising layer or substrate.

Figure 4:
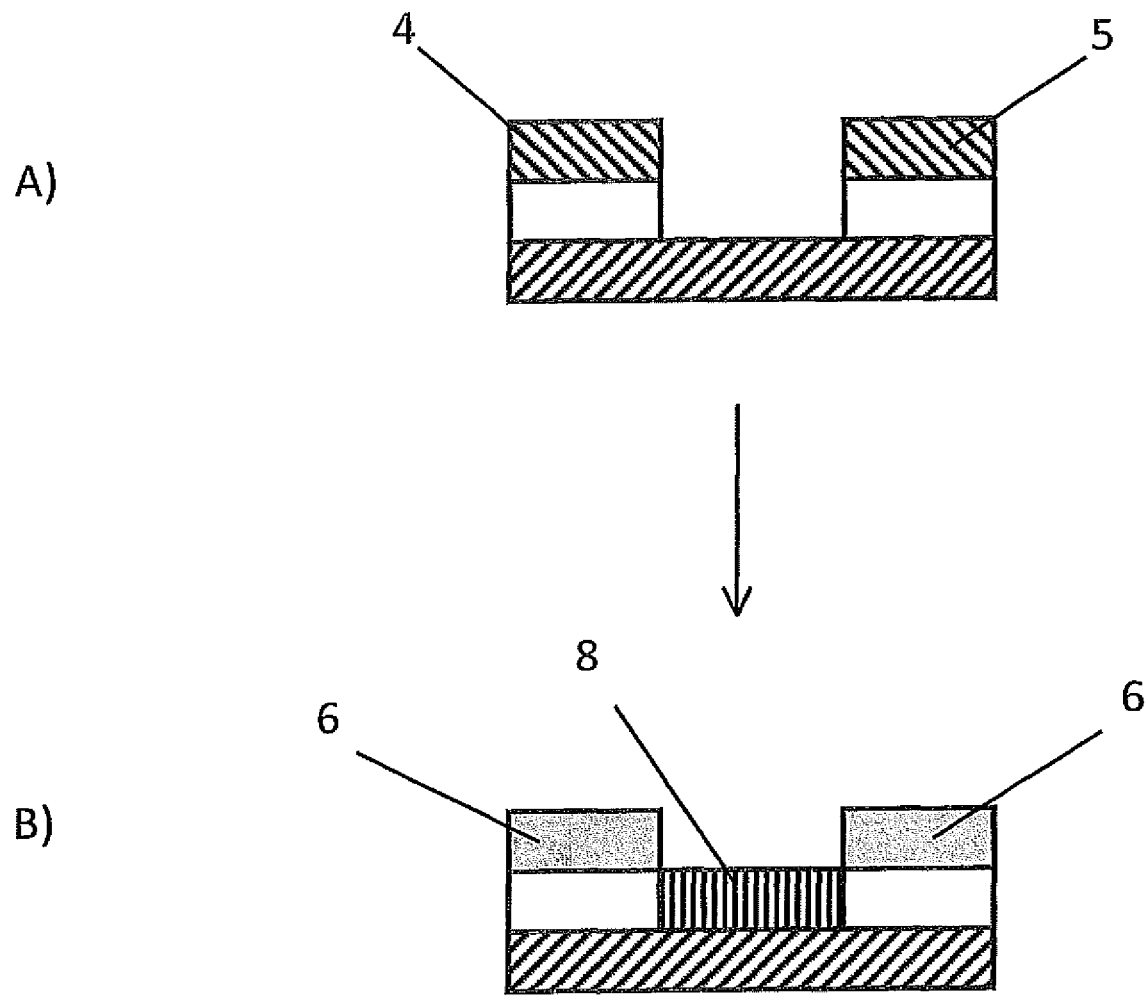
FIG. 4 shows the deposition of a SAM material, both over the contacts and within the channel region.

Embodiment 3—A first SAM material is deposited over the source and drain contacts and a second SAM material is deposited over the substrate surface:

In a further embodiment shown in FIG. 4, the conductive layer is patterned to form the source and drain electrodes 4, 5 according to the above described photolithography process, followed by the deposition of a first SAM material 6, during the stripping of the photoresist, over the source and drain contacts, such that the SAM material adheres to the surface of the electrical contacts. A different SAM material 8 may be deposited, during the same process step, over the substrate surface, such that the SAM adheres only to the surface of the substrate, but not the source and drain contacts, as is shown in FIG. 4 B). The result is that a different SAM layer is formed over the source and drain electrodes to the substrate surface.

Devices such as TFTs fabricated as described above may be part of a more complex circuit or device in which one or more such devices can be integrated with each other and/or with other devices. Examples of applications include logic circuits and active matrix circuitry for a display or a memory device, or a user-defined gate array circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

In conclusion, the invention provides novel systems, devices, methods and arrangements. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A process of forming an electronic device, the electronic device comprising a substrate, a source electrode and a drain electrode and a device channel neighboring said source electrode and drain electrode, wherein a surface of said substrate comprises a surface of said device channel and at least one surface of a conductive layer comprises a surface of said source electrode and a surface of said drain electrode, the process comprising:

removing photoresist from at least one surface of the electronic device using a photoresist stripper mixture, wherein the photoresist stripper mixture comprises a first self-assembled monolayer material and photoresist stripper for dissolving photoresist, thereby depositing a self-assembled monolayer on said at least one surface of said electronic device, and depositing semiconductor material on said self-assembled monolayer deposited on said conductive layer, without ozone cleaning of said conductive layer.

2. The process according to claim 1, wherein said self-assembled monolayer is a first self-assembled monolayer, the process further comprising:

depositing a second self-assembled monolayer material, which is different from said first self-assembled monolayer material, on a surface of said substrate.

3. The process according to claim 1, the process further comprising using said photoresist in a photolithography process of patterning said conductive layer to form a source electrode and a drain electrode.

4. The process according to claim 1, wherein the self-assembled monolayer material comprises a thiol compound comprising sulphur.

5. The process according to claim 4, wherein the self-assembled monolayer material comprises pentafluorobenzenethiol.

6. The process according to claim 1, wherein the photoresist stripper comprises 2-amino ethanol, glycol ether and de-ionized water.

7. The process according to claim 1, wherein the ratio of the self-assembled monolayer material to the photoresist stripper is about 0.0001%-1%.

8. The process of claim 1, wherein said conductive layer comprises a material selected from a group consisting of: silver, and gold.

9. A process of forming an electronic device, the electronic device comprising a substrate comprising a polymer film, a source electrode and a drain electrode and a device channel neighboring said source electrode and said drain electrode, wherein a surface of said substrate comprises a surface of said device channel and at least one surface of a conductive layer comprises a surface of said source electrode and a surface of said drain electrode, the process comprising:

removing photoresist from at least one surface of the electronic device using a photoresist stripper mixture, wherein the photoresist stripper mixture comprises a first self-assembled monolayer material and photoresist stripper for dissolving photoresist, thereby depositing a self-assembled monolayer on said polymer film of said surface of said device channel of said electronic device.

10. The process according to claim 9, the process further comprising using said photoresist in a photolithography process of patterning said conductive layer to form said source electrode and said drain electrode.

11. A process as claimed in claim 9, wherein said substrate is a film selected from a group consisting of: polyethyleneterephtalate, and polyethyleneterephtalene.

12. A process as claimed in claim 9, wherein said self-assembled monolayer material comprises a silane.

13. A process of forming an electronic device, the process comprising:

removing photoresist from at least one surface of the electronic device using a photoresist stripper mixture, wherein the photoresist stripper mixture comprises a first self-assembled monolayer material and photoresist stripper for dissolving photoresist, thereby depositing a self-assembled monolayer on said at least one surface of said electronic device, and depositing semiconductor material on said self-assembled monolayer deposited on said conductive layer, without ozone cleaning of said conductive layer.

14. The process according to claim 13, wherein said electronic device includes a substrate; wherein said self-assembled monolayer is a first self-assembled monolayer wherein said electronic device comprises a source electrode and a drain electrode, the process further comprising:

depositing a second self-assembled monolayer material, which is different from said first self-assembled monolayer material, on a surface of said substrate.

15. The process according to claim 13, the process further comprising:

using said photoresist in a photolithography process of patterning a conductive layer to form a source electrode and a drain electrode.

16. The process according to claim 13, wherein the self-assembled monolayer material comprises a thiol compound comprising sulphur.

17. The process according to claim 13, wherein the self-assembled monolayer material comprises pentafluorobenzenethiol.

18. The process according to claim 13, wherein the photoresist stripper comprises 2-amino ethanol, glycol ether and de-ionized water.

19. The process according to claim 13, wherein the ratio of the self-assembled monolayer material to the photoresist stripper is about 0.0001%-1%.

20. The process of claim 13, wherein said conductive layer comprises a material selected from a group consisting of: silver, and gold.

* * * * *